(12) United States Patent
Goers

(10) Patent No.: US 9,953,912 B2
(45) Date of Patent: Apr. 24, 2018

(54) WORK PIECES AND METHODS OF LASER DRILLING THROUGH HOLES IN SUBSTRATES USING AN EXIT SACRIFICIAL COVER LAYER

(71) Applicant: CORNING INCORPORATED, Corning, NY (US)

(72) Inventor: Uta-Barbara Goers, Campbell, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/138,656

(22) Filed: Apr. 26, 2016

(65) Prior Publication Data

US 2016/0322291 A1    Nov. 3, 2016

Related U.S. Application Data

(60) Provisional application No. 62/153,638, filed on Apr. 28, 2015.

(51) Int. Cl.
*B44C 1/22* (2006.01)
*C03C 15/00* (2006.01)
(Continued)

(52) U.S. Cl.
CPC .... *H01L 23/49827* (2013.01); *B23K 26/0622* (2015.10); *B23K 26/18* (2013.01); *B23K 26/382* (2015.10); *H01L 21/486* (2013.01); *H01L 23/49838* (2013.01); *H01L 23/49894* (2013.01); *H05K 3/002* (2013.01); *H05K 3/0029* (2013.01);
(Continued)

(58) Field of Classification Search
USPC .......................................................... 216/65
See application file for complete search history.

(56) References Cited

U.S. PATENT DOCUMENTS 5,208,068 A    5/1993   Davis et al.
5,965,043 A   10/1999   Noddin et al.
(Continued)

FOREIGN PATENT DOCUMENTS

AU    2011101310    11/2011
CN     1096936 C    12/2002
(Continued)

OTHER PUBLICATIONS

International Search Report and Written Opinion PCT/US2016/029300 dated Aug. 1, 2016.

*Primary Examiner* — Roberts Culbert
(74) *Attorney, Agent, or Firm* — John P. McGroarty; John T. Haran

(57) ABSTRACT

Work pieces and methods of forming through holes in substrates are disclosed. In one embodiment, a method of forming a through hole in a substrate by drilling includes affixing an exit sacrificial cover layer to a laser beam exit surface of the substrate, positioning a laser beam in a predetermined location relative to the substrate and corresponding to a desired location for the through hole, and forming the through hole by repeatedly pulsing the laser beam into an entrance surface of the substrate and through a bulk of the substrate. The method further includes forming a hole in the exit sacrificial cover layer by repeatedly pulsing the laser beam into the through hole formed in the substrate such that the laser beam passes through the laser beam exit surface of the substrate and into the exit sacrificial cover layer.

18 Claims, 4 Drawing Sheets

(51) Int. Cl.

| | | |
|---|---|---|
| *C03C 25/68* | (2006.01) | |
| *C23F 1/00* | (2006.01) | |
| *H01L 23/498* | (2006.01) | |
| *B23K 26/18* | (2006.01) | |
| *B23K 26/0622* | (2014.01) | |
| *B23K 26/382* | (2014.01) | |
| *H01L 21/48* | (2006.01) | |
| *H05K 3/00* | (2006.01) | |
| *H05K 3/40* | (2006.01) | |

(52) U.S. Cl.
CPC ... *H05K 3/4038* (2013.01); *H05K 2203/1383* (2013.01)

(56) References Cited

U.S. PATENT DOCUMENTS

| | | | |
|---|---|---|---|
| 6,319,867 | B1 | 11/2001 | Chacon et al. |
| 6,537,937 | B1 | 3/2003 | Nishizawa et al. |
| 6,737,345 | B1 | 5/2004 | Lin et al. |
| 6,992,030 | B2 | 1/2006 | Paulson |
| 7,008,817 | B2 | 3/2006 | Kim et al. |
| 7,534,734 | B2 | 5/2009 | Ellison |
| 7,763,559 | B2 | 7/2010 | Kurachi et al. |
| 7,772,115 | B2 | 8/2010 | Hiatt |
| 8,007,913 | B2 | 8/2011 | Coppola et al. |
| 8,455,378 | B2 | 6/2013 | Yanese et al. |
| 8,670,182 | B2 | 3/2014 | Tanida et al. |
| 8,796,165 | B2 | 8/2014 | Ellison et al. |
| 8,835,335 | B2 | 9/2014 | Murata et al. |
| 9,023,421 | B2 | 5/2015 | Nakashima |
| 2002/0062563 | A1 | 5/2002 | Koide et al. |
| 2005/0009315 | A1 | 1/2005 | Kim et al. |
| 2007/0045779 | A1 | 3/2007 | Hiatt |
| 2007/0190340 | A1 | 8/2007 | Coppola et al. |
| 2007/0232028 | A1 | 10/2007 | Lee et al. |
| 2010/0292068 | A1 | 11/2010 | Takaya et al. |
| 2011/0316561 | A1 | 12/2011 | Murata et al. |
| 2012/0048604 | A1 | 3/2012 | Cornejo et al. |
| 2012/0135852 | A1 | 5/2012 | Ellison et al. |
| 2012/0135853 | A1 | 5/2012 | Amin et al. |
| 2012/0141668 | A1 | 6/2012 | Nakashima |
| 2012/0308803 | A1 | 12/2012 | Dejneka et al. |
| 2013/0135745 | A1 | 5/2013 | Tanida et al. |
| 2013/0255779 | A1 | 10/2013 | Aitken et al. |
| 2014/0034374 | A1 | 2/2014 | Cornejo et al. |
| 2014/0116091 | A1 | 5/2014 | Chuang et al. |
| 2014/0147623 | A1 | 5/2014 | Shorey et al. |
| 2014/0242375 | A1 | 8/2014 | Mauro et al. |
| 2014/0342897 | A1 | 11/2014 | Amin et al. |
| 2015/0037553 | A1 | 2/2015 | Mauro |
| 2015/0051060 | A1 | 2/2015 | Ellison et al. |
| 2015/0060402 | A1 | 3/2015 | Burkett et al. |
| 2015/0140299 | A1 | 5/2015 | Ellison et al. |
| 2015/0368145 | A1 | 12/2015 | Senshu et al. |
| 2015/0376050 | A1 | 12/2015 | Nakamura et al. |
| 2016/0102009 | A1 | 4/2016 | Boek et al. |

FOREIGN PATENT DOCUMENTS

| | | |
|---|---|---|
| CN | 102795596 | 11/2012 |
| CN | 103534216 | 1/2014 |
| IN | 201102390 | 3/2013 |
| JP | 2002028799 | 1/2002 |
| KR | 1159697 B1 | 6/2012 |
| WO | 8902877 | 4/1989 |
| WO | 2012060277 | 5/2012 |
| WO | 2013030848 | 3/2013 |
| WO | 2013130718 | 9/2013 |
| WO | 2014148020 | 9/2014 |

WORK PIECES AND METHODS OF LASER DRILLING THROUGH HOLES IN SUBSTRATES USING AN EXIT SACRIFICIAL COVER LAYER

CROSS-REFERENCE TO RELATED APPLICATIONS

This application claims the benefit of priority under 35 U.S.C. § 119 of U.S. Provisional Application Ser. No. 62/153,638 filed on Apr. 28, 2015, the content of which is relied upon and incorporated herein by reference in its entirety.

BACKGROUND

Field

The present specification generally relates to the manufacture of glass articles with formed through holes and, more specifically, to methods for laser drilling through holes in substrates using an exit sacrificial cover layer, and work pieces including a substrate and an exit sacrificial cover layer.

Technical Background

Holes may be formed in substrates by methods such as laser machining, photo machining, direct molding, electrical discharge machining, and plasma/reactive etching. Such substrates may be used in a number of electrical devices, such as interposers that route electrical signals between silicon microchips and organic substrates.

In the laser drilling method, pulses of a UV laser are directed to a substrate in predetermined positions to thereby form holes in the substrate at the predetermined positions. The number of pulses applied at each predetermined position may be determined based on the desired depth of the hole in the substrate. The diameters of the holes formed by laser drilling may be modified using an optional etching process. In the etching process, an etching solution is applied to the surface of the substrate, such as by spraying or immersion, after the holes have been drilled into the substrate by the laser. The duration of exposure, temperature, concentration, and chemistry of the etching solution may be determined based upon the desired diameters of the holes in the substrate.

However, as the desired diameter of the through holes and the thickness of the substrate decreases, the exit-to-entry diameter ratio of the through holes decreases to unacceptable levels. Particularly, as the laser beam is pulsed into the glass substrate, the bottom of the hole is tapered and therefore results in a pointed portion. Accordingly, when a through hole is laser drilled by a pulsed laser beam, the exit diameter of the through hole is smaller than the entrance diameter due to the pointed portion. Even after an etching process, because the same amount of glass material is removed across all surfaces of the substrate, the exit-to-entrance diameter ratio remains undesirable due to the small diameters.

Accordingly, a need exists for alternative work pieces and methods for forming through holes having high exit-to-entrance diameter ratios in substrates.

SUMMARY

In a first aspect, a method of forming a through hole in a substrate by drilling includes affixing an exit sacrificial cover layer to a laser beam exit surface of the substrate, positioning a laser beam in a predetermined location relative to the substrate and corresponding to a desired location for the through hole, and forming the through hole by repeatedly pulsing the laser beam into an entrance surface of the substrate and through a bulk of the substrate. The method further includes forming a hole in the exit sacrificial cover layer by repeatedly pulsing the laser beam into the through hole formed in the substrate such that the laser beam passes through the laser beam exit surface of the substrate and into the exit sacrificial cover layer.

A second aspect includes the method of the first aspect, wherein a thickness of the exit sacrificial cover layer is greater than about 100 µm.

A third aspect includes the method of the first or second aspect, wherein the laser beam is pulsed through the substrate and the exit sacrificial cover layer such that the through hole of the substrate has an entrance diameter and an exit diameter, the method further includes etching the substrate with an etching solution, and a ratio between the exit diameter and the entrance diameter is greater than 0.7.

A fourth aspect includes the method of the third aspect, wherein a thickness of the substrate is less than about 150 µm.

A fifth aspect includes the method of the fourth aspect, wherein a thickness of the exit sacrificial cover layer is at least 200 µm.

A sixth aspect includes the method of the fifth aspect, wherein the entrance diameter is less than about 30 µm.

A seventh aspect includes the method of the sixth aspect, wherein the entrance diameter is greater than about 40 µm, and the ratio between the exit diameter and the entrance diameter of the through hole is greater than about 0.8 after etching the substrate. An eighth aspect includes the method of any of the preceding aspects, wherein the exit sacrificial cover layer is a polymer layer.

A ninth aspect includes the method of any of the first through seventh aspects, wherein the exit sacrificial cover layer is a glass layer.

A tenth aspect includes the method of any of the preceding aspects, wherein the laser beam has a wavelength of about 355 nm, the laser beam has a pulse width between about 5 ns and about 75 ns, the laser beam is pulsed at a repetition rate between about 1 kHz and about 30 kHz, and the laser beam has a pulse energy between about 25 µJ and about 175 µJ.

An eleventh aspect includes the method of any of the first through tenth aspects, wherein the laser beam has a wavelength of about 355 nm, and the laser beam has a numerical aperture between about 0.02 and about 0.4.

A twelfth aspect includes the method of any of the preceding aspects, further including affixing an entrance sacrificial cover layer to a laser beam entrance surface of the substrate, and prior to forming the through hole in the substrate, forming a through hole in the entrance sacrificial cover layer by repeatedly pulsing the laser beam at the predetermined location.

A thirteenth aspect includes the method of any one of the first through seventh aspects or any one of the ninth through twelfth aspects, further including applying a fluid to at least one of the exit sacrificial cover layer and the laser beam exit surface of the substrate before attaching the exit sacrificial cover layer to the laser beam exit surface of the substrate.

A fourteen includes the method of any one of the first through seventh aspects or any one of the ninth through twelfth aspects, wherein the exit sacrificial cover layer is affixed to the laser beam exit surface of the substrate by applying a liquid polymer material to the laser beam exit surface of the substrate.

A fifteenth aspect includes the method of any of the preceding aspects, further including removing the exit sacrificial cover layer from the laser beam exit surface of the substrate by applying a solvent to the exit sacrificial cover layer.

A sixteenth aspect includes the method of any of the preceding aspects, wherein the exit sacrificial cover layer is removed after the through hole is formed in the substrate.

A seventeenth aspect includes the method of any of the preceding aspects, further including etching the substrate with an etching solution, and applying an electrically conductive material to the through hole.

An eighteenth aspect includes the method of any of the preceding aspects, wherein the laser beam is pulsed through the substrate and the exit sacrificial cover layer such that the through hole of the substrate has an entrance diameter and an exit diameter, the exit diameter defines an exit hole of the through hole having a circumference C, and the exit surface of the substrate is free from one or more channels extending from the circumference C of the exit hole.

A nineteenth aspect includes the method of any of the preceding aspects, wherein the substrate is glass.

In a twentieth aspect, a work piece having holes includes a substrate having through holes formed therein and an exit sacrificial cover layer having holes formed therein. The substrate includes a laser beam entrance surface and a laser beam exit surface. A longitudinal axis of each through hole extends from the laser beam entrance surface to the laser beam exit surface. Each through hole comprises an entrance diameter at the laser beam entrance surface of the substrate and an exit diameter at the laser beam exit surface. The entrance diameter is less than about 40 µm, and a ratio of the entrance diameter to the exit diameter is greater than about 0.7. The exit sacrificial cover layer is detachably affixed to the laser beam exit surface of the substrate. Each hole of the exit sacrificial cover layer has a longitudinal axis aligned with the longitudinal axis of a corresponding through hole.

A twenty-first aspect includes the work piece of the twentieth aspect, wherein a thickness of the substrate is less than about 150 µm, and a thickness of the exit sacrificial cover layer is greater than about 300 µm.

A twenty-second aspect includes the work piece of the twentieth or twenty-first aspect, wherein the exit diameter defines an exit hole of the through hole having a circumference C, and the exit surface of the substrate is free from one or more channels extending from the circumference C of the exit hole.

A twenty-third aspect includes the work piece of any of the twentieth through twenty-second aspects, wherein the substrate is glass.

Additional features and advantages of the embodiments described herein will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
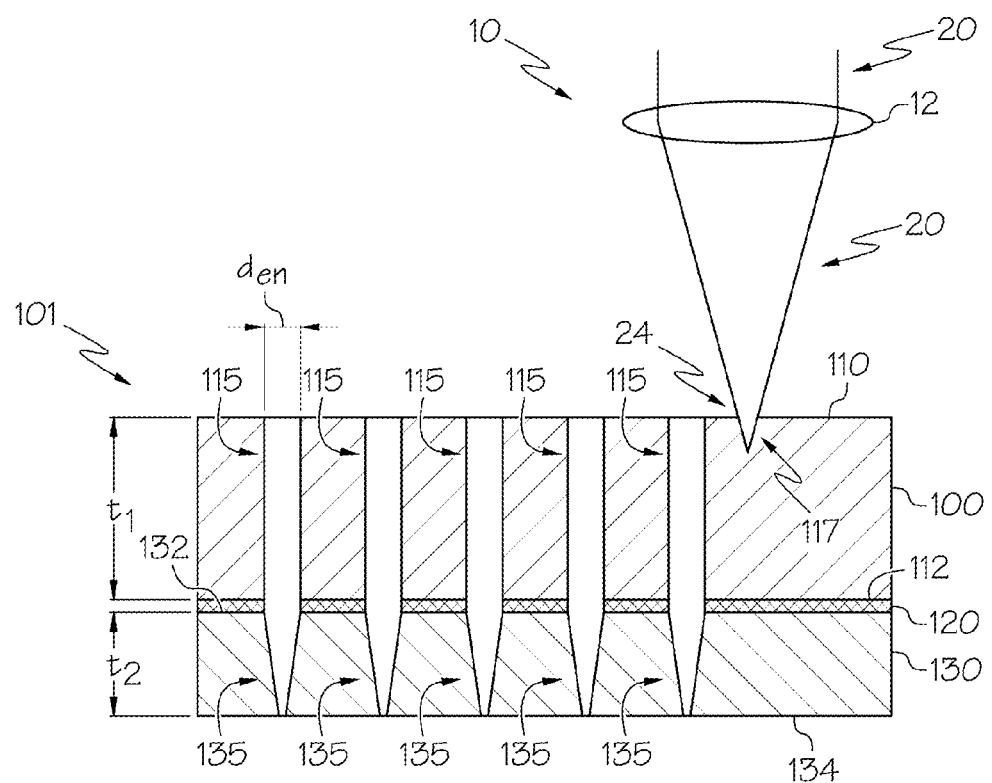
FIG. 1 schematically depicts a cross-sectional view of a laser drilling method using an exit sacrificial cover layer according to one or more embodiments shown and described herein.

Reference will now be made in detail to embodiments of the present disclosure, examples of which are illustrated in the accompanying drawings. Whenever possible, the same reference numerals will be used throughout the drawings to refer to the same or like parts. Embodiments of the present disclosure are directed to methods of forming through holes in a substrate by laser drilling, wherein the through holes have an exit diameter that closely matches an entrance diameter. As an example and not a limitation, such substrates may be glass articles that are used as an interposer in an electronic device, wherein the through holes may be filled with a conductive material to provide through glass vias ("TGV"). As described in more detail herein, an exit sacrificial cover layer is provided on an exit surface of the substrate (i.e., a surface of the substrate that is opposite from an incident or entrance surface that receives the laser beam). The laser beam continues drilling through the exit sacrificial cover layer after fully drilling through the substrate. The exit sacrificial cover layer enables the formation of through holes having a larger exit diameter than a laser drilling process not utilizing an exit sacrificial cover layer. In some embodiments, the laser-drilled substrate is further subjected to an etching process to thin the substrate and/or further shape the laser-drilled through holes.

More specifically, as described in detail below, the exit sacrificial cover layer provides a substrate with through holes having a large exit-to-entry diameter ratio (e.g., greater than 0.8) in thin substrates (e.g., substrates having a thickness of 150 µm or less). Various methods of forming through holes in substrates and laser drilled substrates are described in detail below.

Referring now to FIG. 1, components used in a laser drilling method for forming through holes in a substrate according to embodiments is described herein. The components of the laser drilling method generally include a substrate 100, an exit sacrificial cover layer 130, and a laser drilling system 10 providing a focused laser beam 20. In the embodiment shown in FIG. 1, a coupling surface 132 of the exit sacrificial cover layer 130 may be detachably attached to an exit surface 112 of the substrate 100. The exit surface 112 is opposite from an entrance surface 110 of the substrate 100. The entrance surface 110 is the surface of which the focused laser beam 20 is incident on the substrate 100.

The composition and dimensions of the substrate 100 are not particularly limited, and are selected based on the desired end use of the substrate 100. The substrate may be fabricated from any material capable of being laser-drilled and chemically etched. Example substrate materials include, but are not limited to, glass, glass-ceramic, silicon, and quartz. In some embodiments, the substrate may be fabricated from a transparent material. As used herein, a material is transparent if it has a transmittance of at least 80% in a range from 390 nm to 700 nm as measured by a spectrophotometer. Example transparent substrate materials include, but are not limited to, glass and glass-ceramic. The glass substrate may be, as a non-limiting example, EAGLE XG® glass, or Code 2318 glass, manufactured by Corning, Inc. of Corning, N.Y., or the like.

Additionally, the substrate 100 may be in the shape of a wafer having a 4 inch, 6 inch, 8 inch, or 12 inch diameter in some embodiments. Alternatively, the substrate 100 may be in the form of a sheet having any dimensions suitable for its end use. The thickness $t_1$ of the substrate 100 may also vary depending on its end use. For example, the substrate 100 may have a thickness $t_1$ of from about 30 µm to about 1000 µm. As a non-limiting example, the laser drilling methods described herein have shown to provide improved exit-to-entry diameter ratios of through holes drilled in substrates 100 having a thickness $t_1$ less than about 150 µm. Although substrates having a thickness $t_1$ of less than 150 µm are described herein, it should be understood that the exit sacrificial cover layer may be used to improve through hole quality in substrates having a thickness $t_1$ greater than about 150 µm. Further, it is to be understood that any shape and size of substrate may be used with the method disclosed herein.

The composition of the exit sacrificial cover layer 130 may be any composition that is susceptible to laser drilling. Particularly, the composition of the exit sacrificial cover layer 130 should have a heat density and heat capacity such that the focused laser beam 20 may continue to drill through the exit sacrificial cover layer 130 after fully drilling the substrate 100. The composition of the exit sacrificial cover layer 130 should also provide a self-focusing effect of the laser beam 20 after it exits the substrate 100 and drills through the exit sacrificial cover layer 130, as described in more detail below.

In embodiments, the exit sacrificial cover layer 130 may comprise a polymer film or polymer coating. The polymer may be any polymer material that allows for light guiding or confinement of the laser beam within the narrow channel that the laser beam ablates. The polymer may be any material that may be applied to the exit surface 112 of the substrate 100 substantially free from air gaps, may be ablated at the wavelength of the laser beam (e.g., 355 nm), and may be removed from the exit surface 112 of the substrate 100 without substantial residue. In some embodiments, the polymer material has an index of refraction substantially equal to the index of refraction of the substrate 100. In other embodiments, the polymer material has an index of refraction that is different from the index of refraction of the substrate 100.

As a non-limiting example, Lens Bond Type P-92 manufactured by Summers Optical of Hatfield, Pa. may be used as the exit sacrificial cover layer 130. Other polymer materials may also be utilized, such as Visqueen manufactured by British Polythene Industries, Ltd. of Greenock, Scotland, UK.

In embodiments, the polymer material may be applied to the exit surface 112 of the substrate 100 in a liquid form, and then later cured (e.g., by UV curing, heat treatment, or drying). Application of the polymer material in liquid form may minimize or eliminate air gaps between the exit sacrificial cover layer 130 and the substrate 100, for example. The liquid polymer material may be applied by any appropriate method including, but not limited to, screen printing, slot-coating, or spin-coating methods. As described in more detail below, the polymer material defining the exit sacrificial cover layer 130 may be removed by solvents, a steaming process, peeling, and other methods.

In embodiments, the exit sacrificial cover layer 130 may comprise a glass substrate. The composition of the glass substrate used for the exit sacrificial cover layer 130 is not particularly limited. As a non-limiting example, the glass substrate may be EAGLE XG® glass, or Code 2318 glass, manufactured by Corning, Inc. As another non-limiting example, the glass substrate of the exit sacrificial cover layer 130 may be any of alumino-silicate, boro-silicate, alumino-boro-silicate, soda-lime-silicate, and may be either alkali containing or alkali-free.

The exit sacrificial cover layer 130 should have a thickness $t_2$ to assure that the focused laser beam 20 has material to overshoot the substrate 100 such that the tapered portions of the holes 135 are fully disposed within the exit sacrificial cover layer 130 and the through holes 115 within the substrate 100 are substantially free of any tapered portions proximate the exit surface 112. For example, the exit sacrificial cover layer may have a thickness $t_2$ that is greater than about 100 µm, such as greater than about 200 µm, or greater than about 300 µm.

It is noted that the exit sacrificial cover layer 130 may act as an intermediate carrier for the substrate 100, particularly in applications where the substrate 100 is thin, such as less than about 150 µm. In this manner, the exit sacrificial cover layer 130 provides added strength to the substrate 100 during various manufacturing processes, thereby preventing breakage of the substrate 100 and increasing manufacturing yield.

The substrate 100 may be detachably attached to the exit sacrificial cover layer 130 through direct, physical contact, or by attachment with a fluid. As shown in FIG. 1, the substrate 100 may be attached to the exit sacrificial cover layer 130 by an intermediate material layer 120, such as a fluid or a bonding material. The substrate 100 and the exit sacrificial cover layer 130 should be coupled together substantially without air inclusions. It is noted that air gaps between the substrate 100 and the exit sacrificial cover layer 130 may result in damage around the exit openings of the through holes 115 at the exit surface 112 of the substrate 100.

In some embodiments, where the exit sacrificial cover layer 130 is detachably coupled to the substrate 100 through direct, physical contact, the coupling surface 132 of the exit sacrificial cover layer 130 may be molecularly bonded to the exit surface 112 of the substrate 100 by ionic bonding, covalent bonding, and/or Van der Waals attraction forces. Molecularly bonding the exit sacrificial cover layer 130 to the substrate 100 may provide for a bond that is highly uniform, and may result in holes with higher quality (e.g., reduced chipping and holes having well-defined circularity) than other coupling methods.

In embodiments, both the coupling surface 132 of the exit sacrificial cover layer 130 and the surface 112 of the substrate 100 may be smooth, have a low particle count, and be substantially free of organic or other materials. The bonding energy provided by the molecular bond, such as Van der Waals attraction forces, should be sufficient to maintain the exit sacrificial cover layer 130 and the substrate 100 in a coupled relationship throughout the laser drilling process. As an example and not a limitation, the bonding energy may be between about 30 $mJ/m^2$ and about 100 $mJ/m^2$ to maintain the exit sacrificial cover layer 130 and the substrate 100 in a coupled relationship during the laser drilling process. The surfaces 112 and 132 may have a smoothness to allow for molecular bonding to be maintained throughout the laser drilling process. As an example and not a limitation, the coupling surface 132 of the exit sacrificial cover layer 130 and the exit surface 112 of the substrate 100 may have a surface smoothness found in fusion-drawn glass substrates, such as Corning EAGLE XG®. It should be understood that other glass substrates may be utilized.

The surfaces of the exit sacrificial cover layer 130 and the substrate 100 may be cleaned before they are attached to one another to minimize any gap(s) between the exit sacrificial cover layer 130 and the substrate 100. In embodiments, the surfaces 112 and 132 should be substantially free of particles about 1 μm in diameter or larger. Any known or yet-to-be-developed cleaning processes may be used. Non-limiting cleaning processes include RCA Standard Clean 1 ("SC1"), RCA Standard Clean 2 ("SC2"), SC1 plus SC2, and dilute HF, which are typically used in the semiconductor industry.

As stated above, attachment between the exit sacrificial cover layer 130 and the substrate 100 may be provided by an intermediate material layer 120, such as by a fluid layer. Although an intermediate material layer 120 is illustrated in FIG. 1, it should be understood that no intermediate material layer 120 will be present in applications wherein the exit sacrificial cover layer 130 and the substrate 100 are coupled by direct contact. Exemplary fluid attachment may include applying a thin layer of water or oil to one or both of the substrate 100 and the exit sacrificial cover layer 130, and attaching the substrate 100 to the exit sacrificial cover layer 130 by Van der Waals interactions. Oils used to attach the substrate 100 and the exit sacrificial cover layer 130 to one another are not particularly limited and may include optical index matching fluid from Cargille Laboratories, vegetable oil, canola oil, peanut oil, or the like. The intermediate material layer 120 may also be an optical index matching adhesive.

After the substrate 100 is attached to the exit sacrificial cover layer 130, through holes 115 are laser-drilled using the laser drilling system 10, such as illustrated in FIG. 1. The desired location or pattern of holes to be formed in the substrate 100 may be determined before forming the holes based on the desired use of the substrate. Referring to FIG. 1, the example laser drilling system 10 includes a laser source (not shown) that produces an output laser beam 20, and coupling optics 12 that focuses or otherwise conditions the laser beam 20 such that it is positioned incident to an entrance surface 110 of the substrate 100 (or an entrance sacrificial cover layer 140 as described below and illustrated in FIG. 7). The laser beam 20 may be positioned in a location on the top surface of the exit sacrificial cover layer 130 that corresponds to a predetermined location of a hole in the substrate 100.

The laser beam 20 may be any laser beam having optical properties capable of drilling the exit sacrificial cover layer 130 and the substrate 100. In one embodiment, the laser beam 20 may be an ultra-violet (UV) laser beam that is a frequency tripled neodymium-doped yttrium orthovanadate ($Nd:YVO_4$) laser, which emits a wavelength of about 355 nm. The laser beam may interact with the material of the substrate through a nonlinear absorption mechanism, vaporizing the substrate material and creating a plasma that ejects material from the substrate, thereby forming a hole. Although an $Nd:YVO_4$ laser is described above, it should be recognized that any laser that is capable of forming a through hole in the exit sacrificial cover layer 130 may be used. The laser beam 20 incident on the entrance surface 112 of the substrate 100 may have a numerical aperture between 0.01 and 0.5, such as between 0.02 and 0.4, between 0.05 and 0.3, between 0.06 and 0.2, and preferably 0.07. The focus of the laser beam relative to the entrance surface 110 of the substrate 100 may be placed within about 200 μm of the top surface, such as within about 100 μm of the entrance surface 112, or within about 50 μm of the entrance surface 112.

Referring to FIG. 1, a plurality of laser-drilled through holes 115 within the substrate 100 and corresponding holes within the exit sacrificial cover layer 130 are illustrated. A partial through hole 117 formed by the laser beam 20 is also illustrated.

The laser beam 20 may be pulsed at the predetermined location to form a through hole 115 in the substrate 100. The pulse duration may be from about 10 nanoseconds to about 40 nanoseconds, or from about 25 nanoseconds to about 35 nanoseconds, or about 30 nanoseconds. The repetition rate of the pulse may be between 1 kHz and 150 kHz, such as between 1 kHz and 75 kHz, or between 1 kHz and 15 kHz. The number of pulses required to form a through hole in the substrate 100 will vary depending on the material of the substrate 100 as well as its thickness. For many glass types, about 0.75 μm of hole depth is formed with each laser pulse. The laser beam may be pulsed any number of times required to form a through hole in the substrate 100.

The material of the substrate 100 provides a light guiding or focusing effect of the laser beam 20 as it is pulsed to deeper depths within the substrate 100. This light guiding or focusing effect provides a laser drilling process wherein the focus of the laser beam 20 does not need to be continuously adjusted as the laser beam 20 is pulsed to deeper depths. Because the laser beam maintains its focus as it drills deeper into the substrate 100, the same process may be used to create high aspect ratio through holes by simply adjusting the number of laser pulses.

As stated above, the exit sacrificial cover layer 130 is provided to increase the exit diameter $d_{ex}$ of a through hole 115 to more closely match the entrance diameter $d_{en}$ of the through hole 115. The blind hole 117 that is partially formed within the substrate 100 has a taper and therefore a "pointed" shape at its bottom. When the laser beam 20 is pulsed fully through the thickness $t_4$ of the substrate 100 and the blind hole 117 therefore becomes a through hole, the through hole has a tapered portion at the exit surface 112 such that the exit diameter $d_{ex}$ is smaller than the entrance diameter $d_{en}$. As a non-limiting example, the exit diameter $d_{ex}$ is on average about 12 μm smaller than the entrance diameter $d_{en}$. As described in more detail below, the etching process may remove about the same amount of material from all surfaces, which leads to the exit diameter $d_{ex}$ still being smaller than the entrance diameter $d_{en}$. For small diameter through holes, such as less than 50 μm, less than 30 μm, less than 25 μm, less than 20 μm, or less than 15 μm, the smaller exit hole diameter $d_{ex}$ (e.g., smaller than about 5 μm) yields through holes having low exit-to-entry ratios, such as less than about 0.6, or where the exit diameter is only about half of the size of the top diameter. Low exit-to-entry ratios may be undesirable in certain applications, such as interposer applications.

After the laser beam is pulsed fully through the substrate 100, the coupling surface 132 of the exit sacrificial cover layer 130 is exposed to the laser beam 20. The laser beam 20 may be pulsed into the through hole 115 any number of times to form a hole 135 in the exit sacrificial cover layer 130. The material of the exit sacrificial cover layer 130 also self-focuses the laser beam 20 as the laser beam 20 ablates the exit sacrificial cover layer 130, as described above with respect to the substrate 100. The holes 135 in the exit sacrificial cover layer 130 have longitudinal axes that align with longitudinal axes of the through holes 115 formed in the substrate 100.

As shown in FIG. 1, the laser beam 20 is pulsed into the exit sacrificial cover layer 130 until the through hole 115 in the substrate does not have a tapered portion at the exit surface 112. Rather, the tapered portion is within the hole 135 of the exit sacrificial cover layer 130. Accordingly, the exit hole diameter $d_{ex}$ of the through holes 115 more closely matches the entrance diameter $d_{en}$. In embodiments, the exit-to-entry ratio (i.e., $d_{ex}/d_{en}$) is greater than about 0.7 for entrance diameters $d_{en}$ within a range of about 25 μm to about 40 μm, and greater than about 0.8 for entrance diameters greater than about 40 μm.

It is noted that the holes 135 within the exit sacrificial cover layer 130 may be blind holes or through holes.

Figure 2:
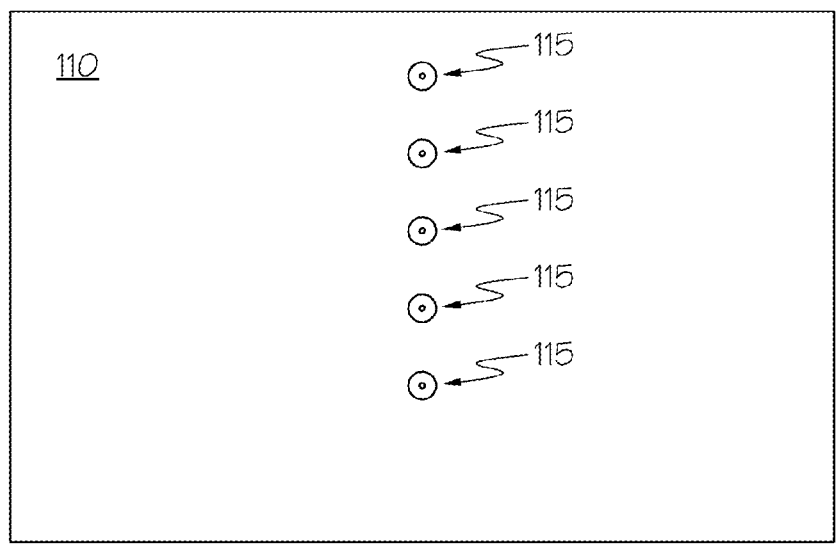
FIG. 2 schematically depicts a top view of a substrate in a laser drilling method using an exit sacrificial cover layer according to one or more embodiments shown and described herein.

FIG. 2 is a top view of a substrate 100 in which multiple though holes 115 have been drilled. In embodiments, multiple through holes 115 in the substrate and multiple holes 135 in the exit sacrificial cover layer may be made by the method described above. The laser may be positioned in one predetermined location and form the through hole 115 in the substrate 100 and the hole 135 in the exit sacrificial cover layer 130 at that predetermined position before the laser is placed in a different predetermined location. Alternatively, the laser may first form through holes 115 in the substrate 100 at multiple predetermined locations and, subsequently, return to the locations of the through holes 115 in the substrate 100 to form holes 135 in the exit sacrificial cover layer 130.

The exit sacrificial cover layer 130 may be removed after the holes 135 in the exit sacrificial cover layer 130 have been formed. The exit sacrificial cover layer 130 may be removed by any suitable method, such as prying off or physically separating the exit sacrificial cover layer 130 from the substrate 100, or applying a solvent to remove any fluid used to attach the exit sacrificial cover layer 130 to the substrate 100.

In some embodiments, the material for the exit sacrificial cover layer 130 may be chosen to have a coefficient of thermal expansion that is different from the coefficient of thermal expansion of the substrate 100. If the exit sacrificial cover layer 130 has a different coefficient of thermal expansion from the substrate 100, the two components will expand at different rates upon heating, which may aid in removing the exit sacrificial cover layer 130 without damage. For example, in embodiments, the substrate 100 is aided by heating the exit sacrificial cover layer 130 and the substrate 100 such that the exit sacrificial cover layer 130 expands at a greater rate than the substrate 100. The exit sacrificial cover layer 130 may then be pulled away from the substrate 100.

In embodiments where the exit sacrificial cover layer 130 is made of a polymer material, the exit sacrificial cover layer 130 may be removed by any appropriate means. For example, the polymer exit sacrificial cover layer 130 and the substrate 100 may be placed in a hot water bath (e.g., about 80° C. to about 100° C. or other temperature) and soaked for a period of time, or steamed in a closed container. The polymer exit sacrificial cover layer 130 may then be peeled from the exit surface 112 of the substrate 100. The polymer exit sacrificial cover layer 130 may also be removed by soaking the polymer exit sacrificial cover layer 130 and substrate 100 in a solvent, such as N-Methyl-2-pyrrolidone, which may facilitate the release of the polymer exit sacrificial cover layer 130 from the exit surface 112. In yet other embodiments, the polymer exit sacrificial cover layer 130 may be peeled from the exit surface 112 of the substrate 100 without application of solvents or steam.

Figure 3:
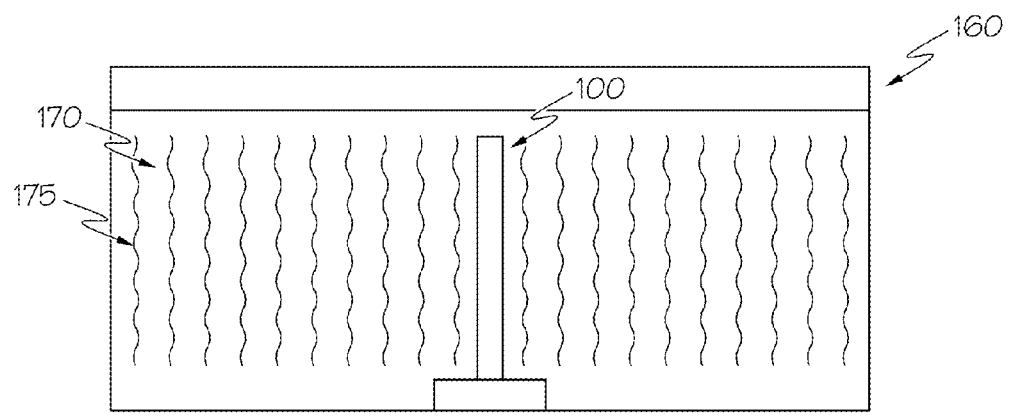
FIG. 3 schematically depicts a substrate in an etching bath according to one or more embodiments shown and described herein.

In embodiments, an etching process may optionally be performed on the substrate 100 after the exit sacrificial cover layer 130 has been removed to further shape the laser drilled through holes 115. The etching process is not particularly limited and may include acid etching. The substrate 100 may be disposed in an etching solution 170 of an etching bath 160, as illustrated in FIG. 3. The etching solution may include at least one of hydrofluoric acid, nitric acid, and acetic acid. If a base solution is used, the solution may include one or more of KOH, $NH_4OH$, and tetramethyl ammonium hydroxide (TMAH). The solution may alternatively or additionally include an additive, such as isopropyl alcohol, hydrogen peroxide, or ozonated deionized water. In embodiments, the etching solution may include a mixture of hydrofluoric acid and nitric acid including from about 10% to about 30% HF and from about 5% to about 15% $HNO_3$, such as about 20% HF and about 10% $HNO_3$. Generally, for glass substrates, the glass removal rate from the etchant may be from about 2 μm/min to about 20 μm/min, such as from about 3 μm/min to about 15 μm/min, or from about 5 μm/min to about 10 μm/min. The etching may be isotropic and may enlarge the diameter of the through hole 115 formed in the substrate 100 as well as reduce the thickness of the substrate 100. The etching solution may be applied by an application process including, but not limited to, sprayed onto the substrate, or the substrate may be immersed in the etching solution. The duration of the etching process is not limited and may be determined based on the etch rate of the etching solution and the desired diameters of the through holes in the substrate. Ultrasonic agitation 175 may also be applied to the etching solution 170 in some embodiments.

Figure 4:
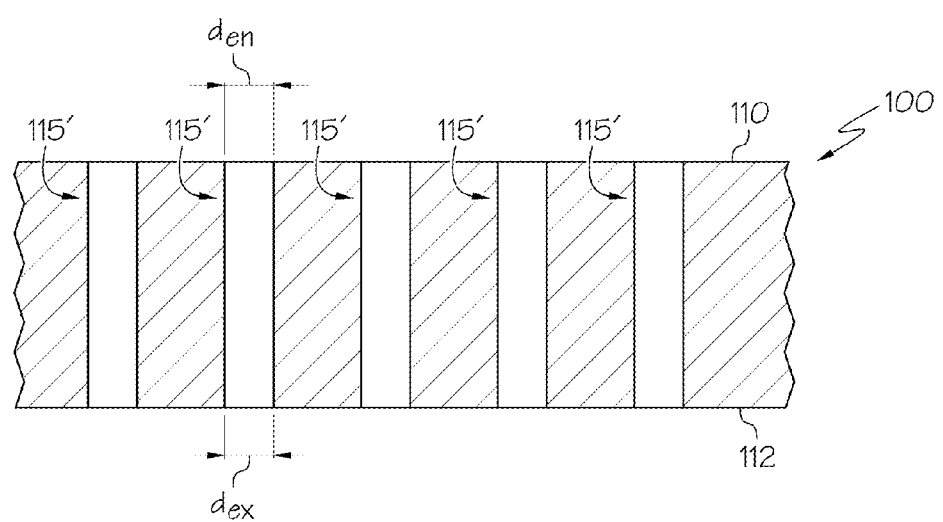
FIG. 4 schematically depicts a partial, cross-sectional view of a substrate having through holes following an etching process according to one or more embodiments shown and described herein.

FIG. 4 depicts a partial cross-sectional view of a substrate 100 following an etching process to enlarge laser drilled through holes 115'. As shown in FIG. 4, due to the use of the exit sacrificial cover layer 130 during the laser drilling process, the exit diameter $d_{ex}$ of the through holes 115 at the exit surface 112 substantially matches the entrance diameter $d_{en}$, thereby providing a large exit-to-entry diameter ratio (e.g., greater than about 0.8).

Additionally, the use of an exit sacrificial cover layer 130 has been shown to improve the exit hole quality of laser-drilled and etched through holes 115. In some cases, laser drilling a substrate creates one or more microcracks or other imperfections extending from the exit hole of a laser-drilled hole 115 prior to etching. During the etching process, these microcracks or other imperfections become enlarged as more material is removed during the etching process at the microcracks than is removed at the undamaged locations. Accordingly, one or more undesirable divots or channels may extend from the laser-drilled and etched through holes 115' following the etching process. As used herein, the words "channel" and "divot" mean areas of the substrate having a reduced thickness.

Figures 5A, 5B:
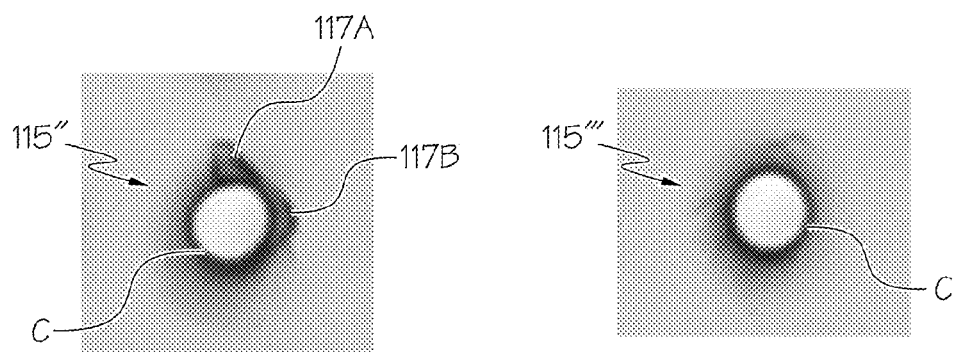
FIG. 5A graphically depicts an exit hole of a laser-drilled and etched through hole in a glass substrate wherein a channel extends from the exit hole.
FIG. 5B graphically depicts an exit hole of a laser-drilled and etched through hole in a glass substrate with no channel extending from the exit hole according to one or more embodiments described herein.

FIG. 5A graphically depicts an exit hole of a laser-drilled and etched through hole 115" within a glass substrate wherein channels 117A, 117B extend from a circumference C of the laser-drilled and etched through hole 115". As shown in FIG. 5A, a thickness of the glass substrate is non-uniform about the circumference C of the laser-drilled and etched through hole 115" due to the presence of the channels 117A, 117B.

It has been shown that use of the exit sacrificial cover layer 130 may prevent the formation of microcracks or other imperfections from extending from the exit holes following the laser-drilling process. The lack of microcracks or other imperfections extending from the exit holes then further prevents channels or divots from opening up during the etching process. Accordingly, the area of the substrate 100 around each through hole 115' has a substantially uniform thickness following the etching process due to the lack of a divot or channel Use of the exit sacrificial cover layer 130 as described herein may provide for substantially uniform thickness of the substrate at an area about the circumference of the exit hole. In other words, the exit holes are substantially circular and free from divots or channels at the circumference.

FIG. 5B graphically depicts an exit hole of a laser-drilled and etched through hole 115''' free from channels or divots in an area about its circumference C. As shown in FIG. 5B, the glass substrate has a substantially uniform thickness in an area about the circumference C of the exit hole of the laser-drilled and etched through hole 115'''.

The substrates 100 with through holes formed therein may be utilized as interposer devices (e.g., glass interposer devices) to route electrical signals between microchips and organic substrates, to fan out electrical connections between dense-pitch chips and wider-pitch layers underneath, to connect multiple silicon chips in two or three dimensional packaging architectures and other applications. Accordingly, in some embodiments, the through holes may be filled with an electrically conductive material during a metallization process to form electrically conductive vias within the through holes. In embodiments, the exit sacrificial cover layer 130 may be left on during the metallization process such that it may protect the substrate from handling damage, as well as act as a mask during the coating of the electrically conductive material. In this manner, the electrically conductive material may only be applied to the through holes. This may reduce the cost of the interposer end product by obviating the need for an additional mask to be added during the metallization process.

The above-described method may be used to form holes of any size and with any pattern in the substrate. The method is not limited to any particular hole size or pattern. However, small exit-to-entry diameter ratios are particularly problematic when the through hole diameter is small (e.g., less than about 100 µm) and the substrate is thin (e.g., less than about 100 µm). Thus, the above method may be used in embodiments having small diameter holes and thin substrates.

Figure 6:
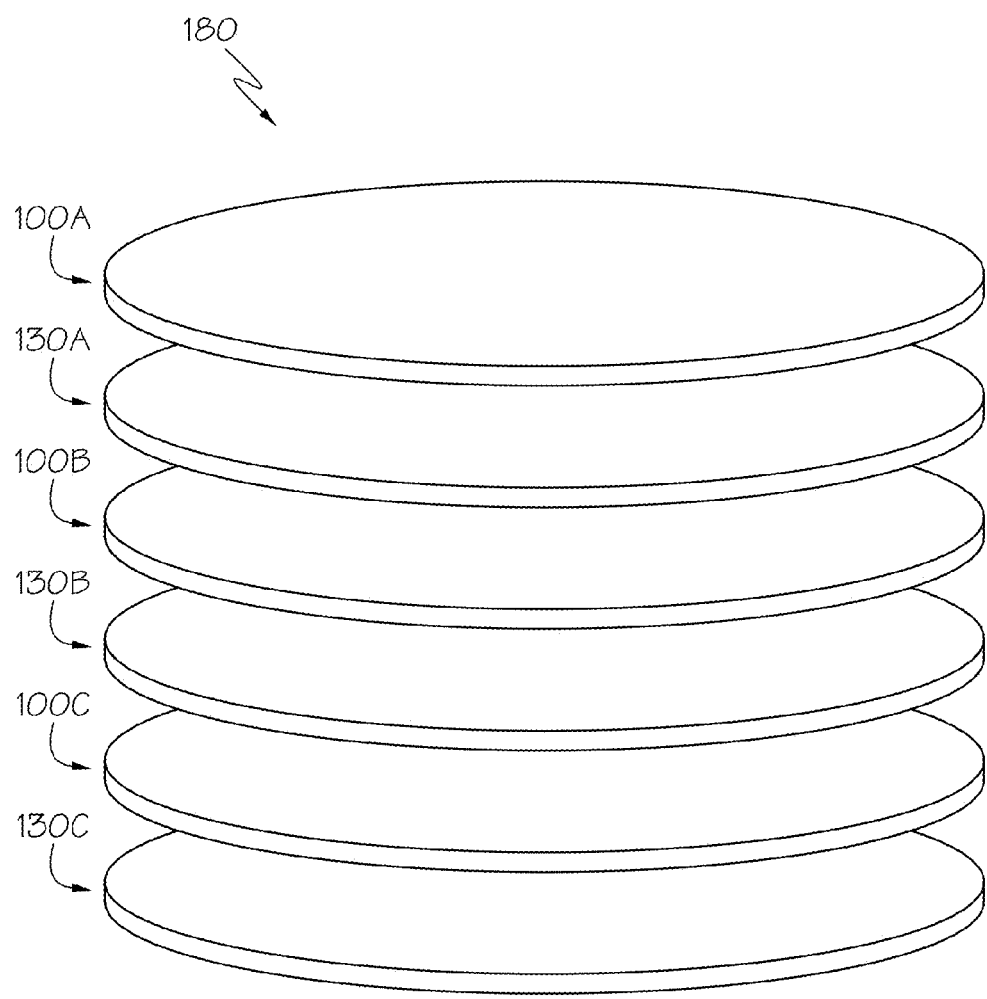
FIG. 6 schematically depicts an exploded, perspective view of a stack comprising alternating substrates and exit sacrificial cover layers according to one or more embodiments shown and described herein.

Referring now to FIG. 6, in some embodiments a stack 180 comprising alternating substrates 100A-100C and exit sacrificial cover layers 130A-130C is illustrated in an exploded perspective view. It should be understood that more or fewer than three substrates and exit sacrificial cover layers may be provided in the stack 180. The exit sacrificial cover layers 130A-130C may be configured as glass substrates that act as carriers for the substrates 100A-100C, such glass carriers may be fabricated from alumino-silicate glass, boro-silicate glass, alumino-boro-silicate glass, soda-lime-silicate glass, and may be either alkali containing or alkali-free. In other embodiments, the exit sacrificial cover layers 130A-130C are fabricated from a polymer material. As described above, the adjacent substrates and exit sacrificial cover layer should be coupled together with minimal air inclusions to provide for high-quality entrance and exit holes in the substrates 100A-100C.

Figure 7:
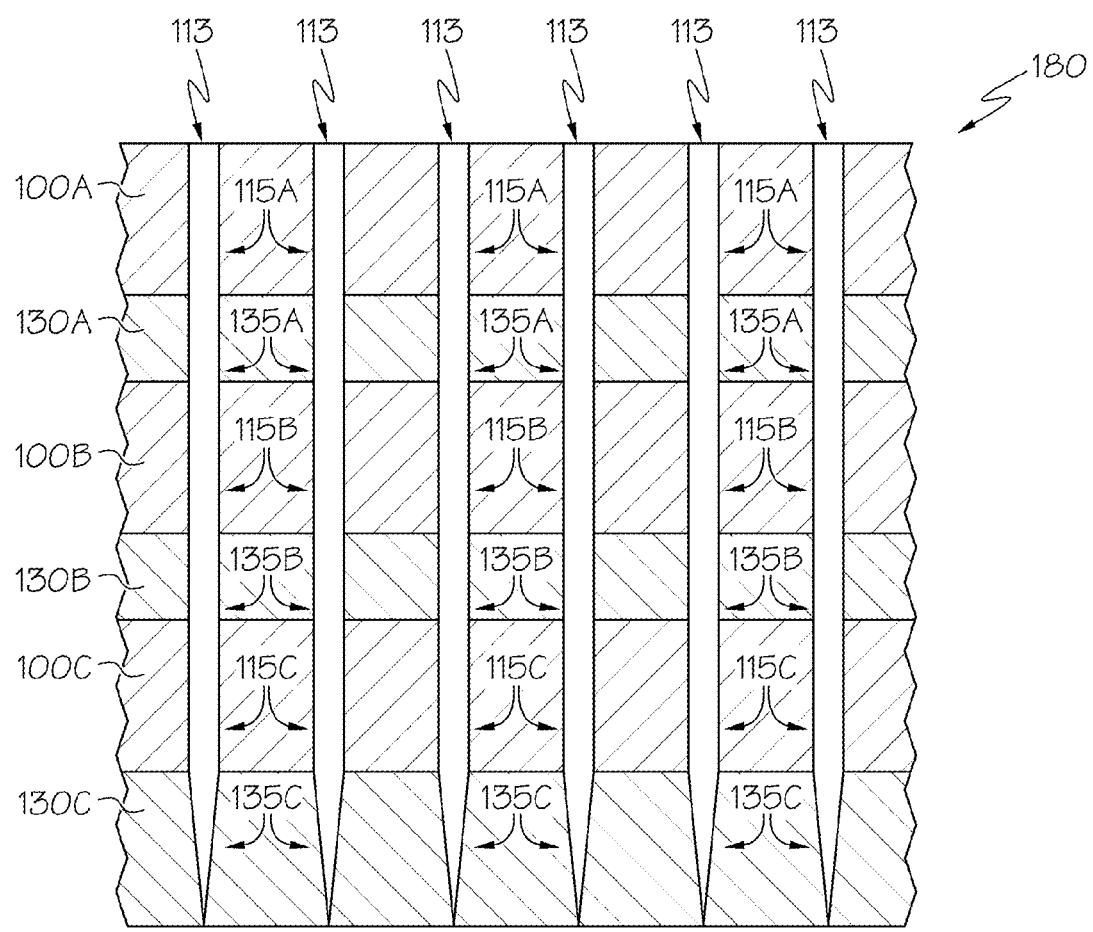
FIG. 7 schematically depicts a partial, cross-sectional view of laser-drilled holes through the stack depicted in FIG. 6 according to one or more embodiments shown and described herein.

FIG. 7 is a cross-sectional view of a partial stack 180 of alternating substrates 100A-100C and exit sacrificial cover layers 130A-130C. The stack 180 may be laser-drilled to manufacture substrates 100A-100C in parallel, thereby increasing throughput. As shown in FIG. 7, holes 113 are laser-drilled by pulsing a laser beam through the entire stack 180, extending through each layer. Each hole 113 includes a first through hole 115A through the first substrate 100A, a first through hole 135A through the first exit sacrificial cover layer 130, a second through hole 115B through the second substrate 100B, a second through hole 135B through the second exit sacrificial cover layer 130B, a third through hole 115C through the third substrate 100C, and a third hole 135 (which may be a blind hole or a through hole) through the third exit sacrificial cover layer 130C. The third holes 135C within the third exit sacrificial cover layer 130C are tapered, while the first, second and third through holes 115A-115C are not tapered, thereby providing large exit-to-entrance diameter ratios for the first, second, and third through holes 115A-115C.

After separating the individual layers of the stack 180, the first, second, and/or third substrate 100A, 100B, 100C may be chemically etched to further shape the respective through holes 115A, 115B, 115C.

An entrance sacrificial cover layer may also be provided on an entrance surface of a substrate, such as a single substrate or a top-most substrate of a stack as illustrated in FIG. 7. The entrance sacrificial cover layer may be provided to reduce entry-hole defects and improve entry-hole quality. The entrance sacrificial cover layer may prevent entry-hole chipping, as well as improve entry-hole circularity.

Figure 8:
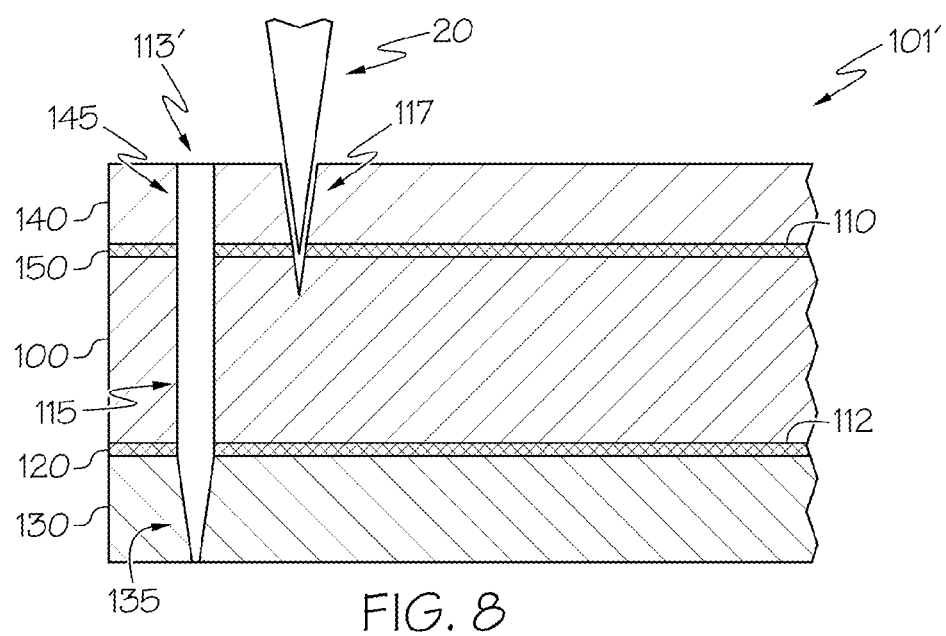
FIG. 8 schematically depicts a cross-sectional view of a laser drilling method using an entrance sacrificial cover layer and an exit sacrificial cover layer according to one or more embodiments shown and described herein.

FIG. 8 is a cross-sectional, partial view of an entrance sacrificial cover layer 140 coupled to an entrance surface 110 of a substrate 100 via intermediate bonding material layer 150, and an exit sacrificial cover layer 130 coupled to an exit surface 112 of the substrate 100 via intermediate bonding material layer 120. It should be understood that no intermediate bonding material layers 120, 150 may be provided, and that the entrance sacrificial cover layer 140 and the exit sacrificial cover layer 130 may be directly attached to the substrate 100, as described above. FIG. 8 further depicts a hole 113' through the stack defined by the entrance sacrificial cover layer 140, the substrate 100, and the exit sacrificial cover layer 130. The hole 113' is defined by a through hole 145 through the entrance sacrificial cover layer 140, a through hole 115 through the substrate 100, and a hole 135 (which may be a through hole or a blind hole) through the exit sacrificial cover layer 130.

The entrance sacrificial cover layer 140 may be configured as a polymer layer or a glass layer similar to the exit sacrificial cover layer 130 described above. Additional materials may be used as the entrance sacrificial cover layer, such as inks, oils, wax, and the like, as described in U.S. Pat. Publ. No. 2014/0147623 filed on Nov. 27, 2013, which is hereby incorporated by reference in its entirety.

The thickness of the entrance sacrificial cover layer 140 is not particularly limited. However, the number of laser pulses required to form a through hole in the entrance sacrificial cover layer 140 increases as the thickness of the entrance sacrificial cover layer 140 increases, thus a thick entrance sacrificial cover layer 140 increases process time. Also, if the entrance sacrificial cover layer 140 is too thin, detachment of the entrance sacrificial cover layer 140 may be difficult without the entrance sacrificial cover layer 140 fragmenting into many pieces. The thickness of the entrance sacrificial cover layer 140 may vary depending on the composition of the sacrificial cover layer. The entrance sacrificial cover layer 140 may have any dimensions provided that it covers the substrate in locations where holes are to be formed. Accordingly, the entrance sacrificial cover layer 140 may have the same dimensions as the substrate 100.

The laser beam 20 is directed to a predetermined location on a surface of the entrance sacrificial cover layer 140, and the laser beam 20 is pulsed to form a through hole 145 in the entrance sacrificial cover layer 140 at the predetermined position. The laser beam is further directed through the through hole 145 formed in the entrance sacrificial cover layer 140 and may form through holes 115 in the substrate 100. The laser beam 20 is further pulsed to drill into the exit sacrificial cover layer 130 as described above.

After formation of the laser drilled holes, the entrance sacrificial cover layer 140 and exit sacrificial cover layer 130 may be removed from the substrate 100. In some embodiments, the substrate 100 may be subjected to an etching process to further shape the through hole(s) 115, as described above.

Another embodiment provides a work piece 101 used with the above described method. Referring to FIG. 1, the work piece 101 may include a substrate 100 and an exit sacrificial cover layer 130 detachably affixed to an exit surface 112 of the substrate 100. The substrate 100 has through holes 115 formed therein by the method described above. Longitudinal axes of the through holes 115 extend in a thickness direction of the substrate 100. The exit sacrificial cover layer comprises holes 135 (which may be through holes or blind holes), each hole 135 has a longitudinal axis corresponding to a longitudinal axis of a corresponding through hole 115 formed in the substrate 100. An intermediate material layer 120 may be present between the exit sacrificial cover layer 130 and the substrate 100.

The thickness of the substrate may be less than about 1000 μm, such as less than about 750 μm, less than about 500 μm, less than about 250 μm, preferably less than about 150 μm. Each through hole 115 has an entrance diameter $d_{en}$ in an entrance surface 110 of the substrate 100, and an exit diameter $d_{ex}$ in an exit surface 112 of the substrate. The entrance diameter $d_{en}$ of the through holes is less than about 50 μm. Each through hole 115 has an exit-to-entrance diameter ratio ($d_{en}/d_{ex}$) greater than 0.7, preferably greater than 0.8. The through holes may have a spacing of from about 200 μm to about 1000 μm, such as from about 200 μm to about 800 μm, from about 200 μm to about 600 μm, from about 250 μm to about 500 μm and from about 300 μm to about 400 μm.

The exit sacrificial cover layer 130 may have a thickness greater than 100 μm, such as greater than 200 μm.

In some embodiments, the work piece 101' further comprises an entrance sacrificial cover layer 140 detachably affixed to an entrance surface 110 of the substrate 100 (FIG. 8). The entrance sacrificial cover layer 140 may be a glass entrance sacrificial cover layer, a polymer entrance sacrificial cover layer, or a thin pigment or dye-based ink entrance sacrificial cover layer. The entrance sacrificial cover layer 140 may be detachably attached to the substrate 100. The entrance sacrificial cover layer 140 comprises through holes 145, each have a longitudinal axis corresponding to a longitudinal axis of a through hole 115 formed in the substrate 100.

EXAMPLES

Embodiments of the present disclosure will be further clarified by the following examples.

Comparative Examples

Comparative Example 1 shows holes formed in a substrate configured as a glass article by laser drilling with no exit sacrificial cover layer used.

In Comparative Example 1, the glass article is made of EAGLE XG®, manufactured by Corning, Inc., and has a thickness of 130 μm. Through holes are formed using a 355 nm nanosecond pulsed laser. A 50 μm thick layer of Lens Bond Type P-92 is used as an entrance sacrificial cover layer. An exit sacrificial cover layer is not used. The entrance diameter $d_{en}$ of the resulting through holes is about 17 μm and the exit diameter $d_{ex}$ is about 5 μm prior to etching. The pre-etch exit-to-entry diameter ratio is about 0.3. Following a HF etching process, about 8 μm of glass material is removed providing a glass article that is about 122 μm thick. The post-etch entrance diameter $d_{en}$ of the through holes is about 25 μm, and the post-etch exit diameter $d_{ex}$ is about 13 μm. The post-etch exit-to-entry diameter ratio is about 0.5.

Comparative Example 2

Comparative Example 2 shows holes formed in a substrate configured as a glass article by laser drilling with no exit sacrificial cover layer used.

In Comparative Example 2, the glass article is made of EAGLE XG®, manufactured by Corning, Inc., and has a thickness of 130 μm. Through holes are formed using a 355 nm nanosecond pulsed laser. A 50 μm thick layer of Lens Bond Type P-92 is used as an entrance sacrificial cover layer. An exit sacrificial cover layer is not used. The glass article is etched using an HF etching process. The post-etch entrance diameter $d_{en}$ of the through holes is about 31 μm, and the post-etch exit diameter $d_{ex}$ is about 17.8 μm. The post-etch exit-to-entry diameter ratio is about 0.58.

Example 1

Example 1 shows the effect of forming through holes in a substrate configured as a glass article according to an exit sacrificial cover layer method described herein, wherein the exit sacrificial cover layer is configured as a 100 μm thick layer of Lens Bond Type P-92.

In Example 1, the glass article is made of EAGLE XG®, manufactured by Corning, Inc., and has a thickness of 130 μm. Through holes are formed using a 355 nm nanosecond pulsed laser. A 50 μm thick layer of Lens Bond Type P-92 is used as an entrance sacrificial cover layer. In addition, an exit sacrificial cover layer of Lens Bond Type P-92 having a thickness of 100 μm is applied to an exit surface of the glass article. For each through hole, additional laser pulses are added to accommodate for the thicker stack of material provided by the exit sacrificial cover layer. After removal of the sacrificial cover layer, the glass article is etched using an HF etching process. The post-etch entrance diameter $d_{en}$ of the through holes is about 31 µm, and the post-etch exit diameter $d_{ex}$ is about 18.8 µm. The post-etch exit-to-entry diameter ratio is about 0.61.

Example 2

Example 2 shows the effect of forming through holes in a substrate configured as a glass article according to an exit sacrificial cover layer method described herein, wherein the exit sacrificial cover layer is configured as a 200 µm thick layer of Lens Bond Type P-92.

In Example 2, the glass article is made of EAGLE XG®, manufactured by Corning, Inc., and has a thickness of 130 µm. Through holes are formed using a 355 nm nanosecond pulsed laser. A 50 µm thick layer of Lens Bond Type P-92 is used as an entrance sacrificial cover layer. In addition, an exit sacrificial cover layer of Lens Bond Type P-92 having a thickness of 200 µm is applied to an exit surface of the glass article. For each through hole, additional laser pulses are added to accommodate for the thicker stack of material provided by the exit sacrificial cover layer. After removal of the sacrificial cover layer, the glass article is etched using an HF etching process. The post-etch entrance diameter $d_{en}$ of the through holes is about 31 µm, and the post-etch exit diameter $d_{ex}$ is about 20.1 µm. The post-etch exit-to-entry diameter ratio is about 0.65.

Example 3

Example 3 shows the effect of forming through holes in a substrate configured as a glass article according to an exit sacrificial cover layer method described herein, wherein the exit sacrificial cover layer is configured as a 300 µm thick layer of Lens Bond Type P-92.

In Example 3, the glass article is made of EAGLE XG®, manufactured by Corning, Inc., and has a thickness of 130 µm. Through holes are formed using a 355 nm nanosecond pulsed laser. A 50 µm thick layer of Lens Bond Type P-92 is used as an entrance sacrificial cover layer. In addition, an exit sacrificial cover layer of Lens Bond Type P-92 having a thickness of 300 µm is applied to an exit surface of the glass article. For each through hole, additional laser pulses are added to accommodate for the thicker stack of material provided by the exit sacrificial cover layer. After removal of the sacrificial cover layer, the glass article is etched using an HF etching process. The post-etch entrance diameter $d_{en}$ of the through holes is about 31 µm, and the post-etch exit diameter $d_{ex}$ is about 21.2 µm. The post-etch exit-to-entry diameter ratio is about 0.68. The use of a 300 µm polymer exit sacrificial cover layer resulted in a 19% increase of the post-etch exit-to-entry diameter ratio from 0.57 to 0.68 over Comparative Example 2.

It is noted that in Examples 1-3, the post-etch exit diameter $d_{ex}$ increased by about 6% for every 100 µm of Lens Bond Type P-92 used as exit sacrificial cover layer.

Example 4

Example 4 shows the effect of forming through holes in a substrate configured as a glass article according to an exit sacrificial cover layer method described herein, wherein the exit sacrificial cover layer is configured as a glass exit sacrificial cover layer.

In Example 4, a 50 mm×50 mm glass article made EAGLE XG®, manufactured by Corning, Inc., is prepared for laser-drilling of through holes using a glass exit sacrificial cover layer. A 50 µm thick layer of Lens Bond Type P-92 is used as an entrance sacrificial cover layer. The glass article has a thickness of 300 µm and is placed on top of two microscope slides, each having a thickness of 1 mm. The glass layers are bonded through van der Waals forces only without the use of an adhesive. The glass article is visually divided into three horizontal stripes. The top third of the glass article is bonded to the first microscope slide, while the bottom third is bonded to the other microscope slide. The center stripe of the glass article remains suspended in mid-air. In this example, the microscope slides serve as a glass exit sacrificial cover layer for two thirds of the glass article, while for one third no exit sacrificial cover layer is used.

Three identical arrays of holes are drilled using a 355 nm nanosecond pulsed laser. Additional laser pulses are added for the top and bottom portions of the glass article to continue the laser-drilling into the glass exit sacrificial cover layer. After removal of the sacrificial cover layers the glass article is etched using an HF etching process. The post-etch entrance diameter $d_{en}$ of the through holes is a uniform 25 µm across the entire glass article. The post-etch exit diameter $d_{ex}$ for the center portion of the glass article that did not use an exit sacrificial cover layer is about 13 µm, while the post-etch exit diameter $d_{ex}$ for the holes that were drilled with a glass exit sacrificial cover layer is about 17.5 µm. Accordingly, an increase of the post-etch exit-to-entry diameter ratio from 0.5 to 0.7 is observed between the through holes with no glass exit sacrificial cover layer and through holes where the glass exit sacrificial cover layer is present.

It is noted that post-etch exit hole diameters may be further increased by increasing the number of laser pulses added to allow the laser beam to drill deeper into the glass exit sacrificial cover layer. Providing better bonding or using a bonding agent between the glass substrate and the glass exit sacrificial cover layer will also improve hole quality and exit diameter.

It should now be understood that embodiments described herein are directed to work pieces and methods of forming a through hole in a glass substrate by laser drilling that employ an exit sacrificial cover layer. The use of an exit sacrificial cover layer results in through holes having an increased exit diameter over laser drilling methods that do not employ an exit sacrificial cover layer. Accordingly, the exit sacrificial cover layer increases an exit-to-entrance diameter ratio of the through holes, such as an exit-to-entrance diameter ratio greater than about 0.8.

It will be apparent to those skilled in the art that various modifications and variations can be made to the embodiments described herein without departing from the spirit and scope of the claimed subject matter. Thus it is intended that the specifications cover the modifications and variations of the various embodiments described herein provided such modification and variations come within the scope of the appended claims and their equivalents.

What is claimed is:

1. A method of forming a through hole in a substrate by drilling, the method comprising:
affixing an exit sacrificial cover layer to a laser beam exit surface of the substrate, wherein the exit sacrificial cover layer has a different composition than the substrate;

positioning a laser beam in a predetermined location relative to the substrate and corresponding to a desired location for the through hole;

forming the through hole by repeatedly pulsing the laser beam into an entrance surface of the substrate and through a bulk of the substrate; and forming a hole in the exit sacrificial cover layer by repeatedly pulsing the laser beam into the through hole formed in the substrate such that the laser beam passes through the laser beam exit surface of the substrate and into the exit sacrificial cover layer, wherein a thickness of the exit sacrificial cover layer is greater than about 100 μm.

2. The method of claim 1, wherein:

the laser beam is pulsed through the substrate and the exit sacrificial cover layer such that the through hole of the substrate has an entrance diameter and an exit diameter;

the method further comprises etching the substrate with an etching solution; and a ratio between the exit diameter and the entrance diameter of the through hole is greater than about 0.7 after etching the substrate.

3. The method of claim 2, wherein a thickness of the substrate is less than about 300 μm.

4. The method of claim 3, wherein a thickness of the exit sacrificial cover layer is at least 200 μm.

5. The method of claim 4, wherein the entrance diameter is greater than about 40 μm, and the ratio between the exit diameter and the entrance diameter of the through hole is greater than about 0.8 after etching the substrate.

6. The method of claim 1, wherein the laser beam is pulsed through the substrate and the exit sacrificial cover layer such that the through hole of the substrate has an entrance diameter and an exit diameter, and the entrance diameter is less than about 40 μm.

7. The method of claim 1, wherein the exit sacrificial cover layer is a polymer layer.

8. The method of claim 1, wherein the laser beam has a wavelength of about 355 nm, the laser beam has a pulse width between about 5 ns and about 75 ns, the laser beam is pulsed at a repetition rate between about 1 kHz and about 30 kHz, and the laser beam has a pulse energy between about 25 μJ and about 175 μJ.

9. The method of claim 1, wherein the laser beam has a wavelength of about 355 nm, and the laser beam has a numerical aperture between about 0.02 and about 0.4.

10. The method of claim 1, further comprising:

affixing an entrance sacrificial cover layer to a laser beam entrance surface of the substrate; and prior to forming the through hole in the substrate, forming a through hole in the entrance sacrificial cover layer by repeatedly pulsing the laser beam at the predetermined location.

11. The method of claim 1, wherein the exit sacrificial cover layer is affixed to the laser beam exit surface of the substrate by applying a liquid polymer material to the laser beam exit surface of the substrate.

12. The method of claim 11, further comprising removing the exit sacrificial cover layer from the laser beam exit surface of the substrate by applying a solvent to the exit sacrificial cover layer.

13. The method of claim 1, wherein the exit sacrificial cover layer is removed after the through hole is formed in the substrate.

14. The method of claim 1, further comprising:

etching the substrate with an etching solution; and applying an electrically conductive material to the through hole.

15. The method of claim 1, wherein:

the laser beam is pulsed through the substrate and the exit sacrificial cover layer such that the through hole of the substrate has an entrance diameter and an exit diameter;

the exit diameter defines an exit hole of the through hole having a circumference C; and the laser beam exit surface of the substrate is free from one or more channels extending from the circumference C of the exit hole.

16. The method of claim 1, wherein the substrate is glass.

17. A method of forming a through hole in a substrate by drilling, the method comprising:

affixing an exit sacrificial cover layer to a laser beam exit surface of the substrate wherein the exit sacrificial cover layer has a different composition than the substrate;

positioning a laser beam in a predetermined location relative to the substrate and corresponding to a desired location for the through hole;

forming the through hole by repeatedly pulsing the laser beam into an entrance surface of the substrate and through a bulk of the substrate; and forming a hole in the exit sacrificial cover layer by repeatedly pulsing the laser beam into the through hole formed in the substrate such that the laser beam passes through the laser beam exit surface of the substrate and into the exit sacrificial cover layer, wherein the exit sacrificial cover layer is a glass layer.

18. A method of forming a through hole in a substrate by drilling, the method comprising:

affixing an exit sacrificial cover layer to a laser beam exit surface of the substrate wherein the exit sacrificial cover layer has a different composition than the substrate;

positioning a laser beam in a predetermined location relative to the substrate and corresponding to a desired location for the through hole;

forming the through hole by repeatedly pulsing the laser beam into an entrance surface of the substrate and through a bulk of the substrate;

forming a hole in the exit sacrificial cover layer by repeatedly pulsing the laser beam into the through hole formed in the substrate such that the laser beam passes through the laser beam exit surface of the substrate and into the exit sacrificial cover layer; and applying a fluid to at least one of the exit sacrificial cover layer and the laser beam exit surface of the substrate before attaching the exit sacrificial cover layer to the laser beam exit surface of the substrate.

* * * * *